(12) United States Patent
Hashimoto et al.

(10) Patent No.: US 7,732,783 B2
(45) Date of Patent: Jun. 8, 2010

(54) ULTRAVIOLET LIGHT MONITORING SYSTEM

(75) Inventors: Jun Hashimoto, Miyagi (JP); Shinji Kawada, Miyagi (JP); Ikuo Kurachi, Tokyo (JP); Seiji Samukawa, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 174 days.

(21) Appl. No.: 12/219,185

(22) Filed: Jul. 17, 2008

(65) Prior Publication Data

US 2009/0058432 A1 Mar. 5, 2009

(30) Foreign Application Priority Data

Aug. 31, 2007 (JP) .............................. 2007-225676

(51) Int. Cl.
 *G01J 1/10* (2006.01)
(52) U.S. Cl. ..................................................... 250/372
(58) Field of Classification Search .................. 250/372
 See application file for complete search history.

(56) References Cited

U.S. PATENT DOCUMENTS

2005/0263247 A1* 12/2005 Samukawa et al. ..... 156/345.24

FOREIGN PATENT DOCUMENTS

JP 2003-282546 10/2003
JP 2005-236199 9/2005

OTHER PUBLICATIONS

Yasushi Ishikawa et al. "Prediction of ultraviolet-induced damage during plasma processes in dielectric films using on-wafer monitoring techniques", Journal of Vacuum Science Technology A, vol. 23, No. 6, pp. 1509-1512, Nov./Dec. 2005.
Mitsuru Okigawa et al., "On-wafer monitoring of plasma-induced electrical current in silicon dioxide to predict plasma radiation damage", Journal of Vacuum Science & Technology B, vol. 23, No. 1, pp. 173-177, Jan./Feb. 2005.
Mitsuru Okigawa et al., "Ultraviolet-induced damage in fluorocarbon plasma and its reduction by pulse-time-modulated plasma in charge coupled device image sensor wafer processes", Journal of Vacuum Science & Technology B, vol. 22, No. 6, pp. 2818-2822, Nov./Dec. 2004.

* cited by examiner

*Primary Examiner*—David P Porta
*Assistant Examiner*—Marcus H Taningco
(74) *Attorney, Agent, or Firm*—Rabin & Berdo, P.C.

(57) ABSTRACT

An ultraviolet light monitoring system includes first and second electrodes, an evaluation subject film and a power source. The first and second electrodes are opposingly disposed and attract holes which are generated in accordance with irradiation of ultraviolet light. The evaluation subject film is formed in a vicinity of the first and second electrodes, and is a subject of evaluation of damage caused by the irradiation of ultraviolet light. The power source, at times of monitoring of the ultraviolet light, applies a predetermined bias to a series path formed by the first electrode, a gap between the first and second electrodes, and the second electrode.

11 Claims, 12 Drawing Sheets

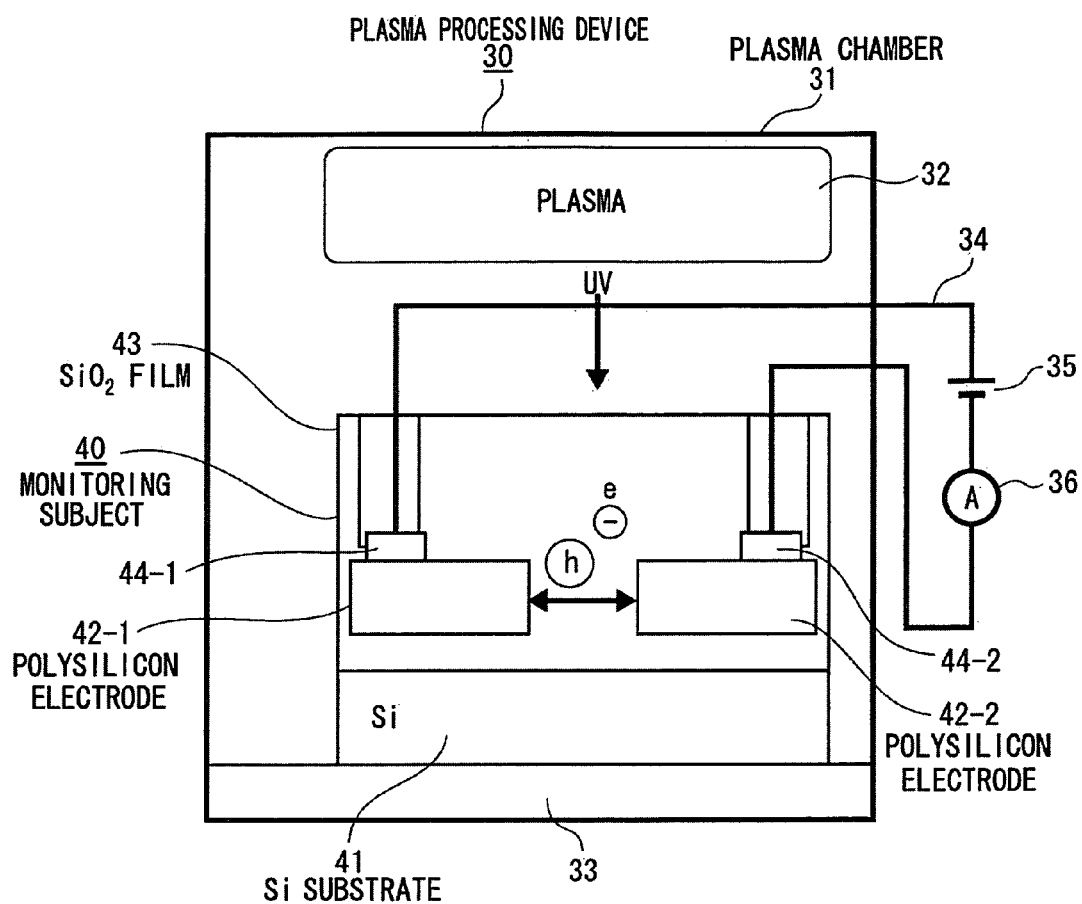

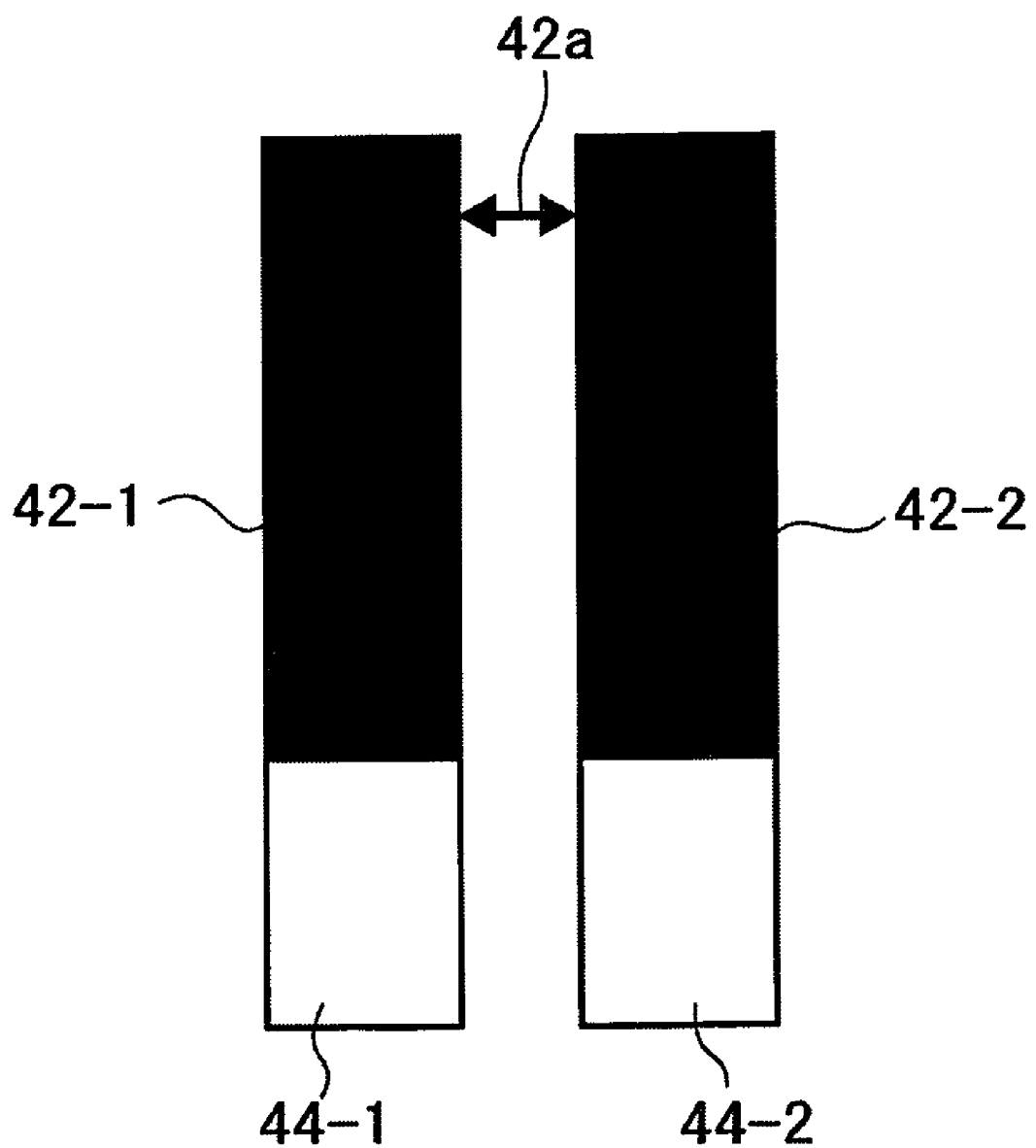

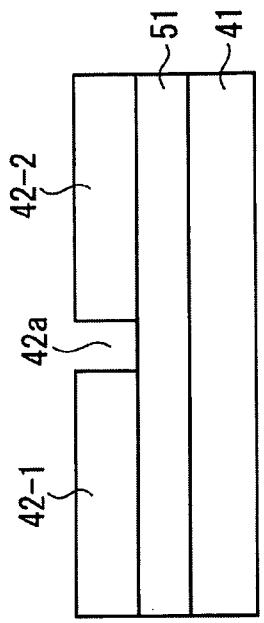
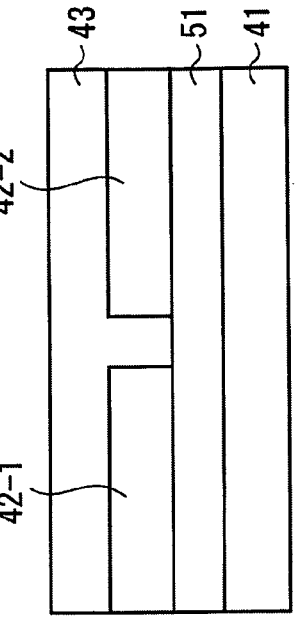
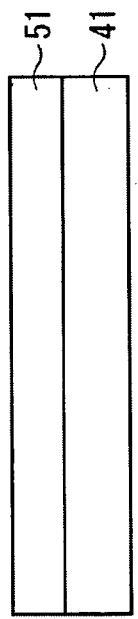
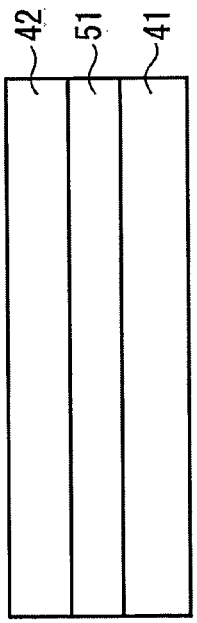
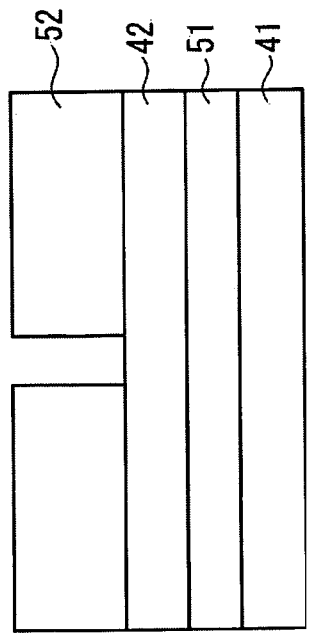

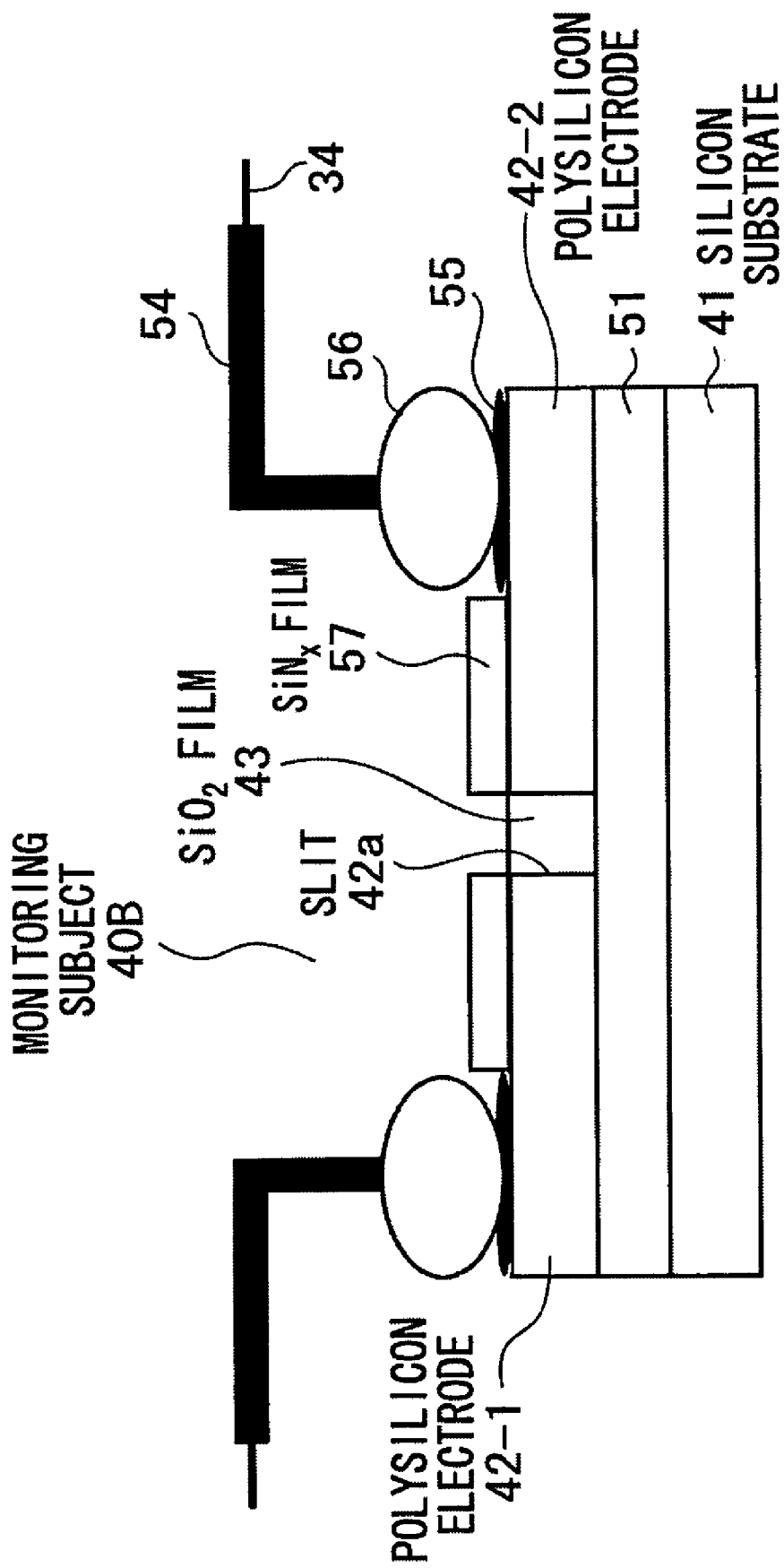

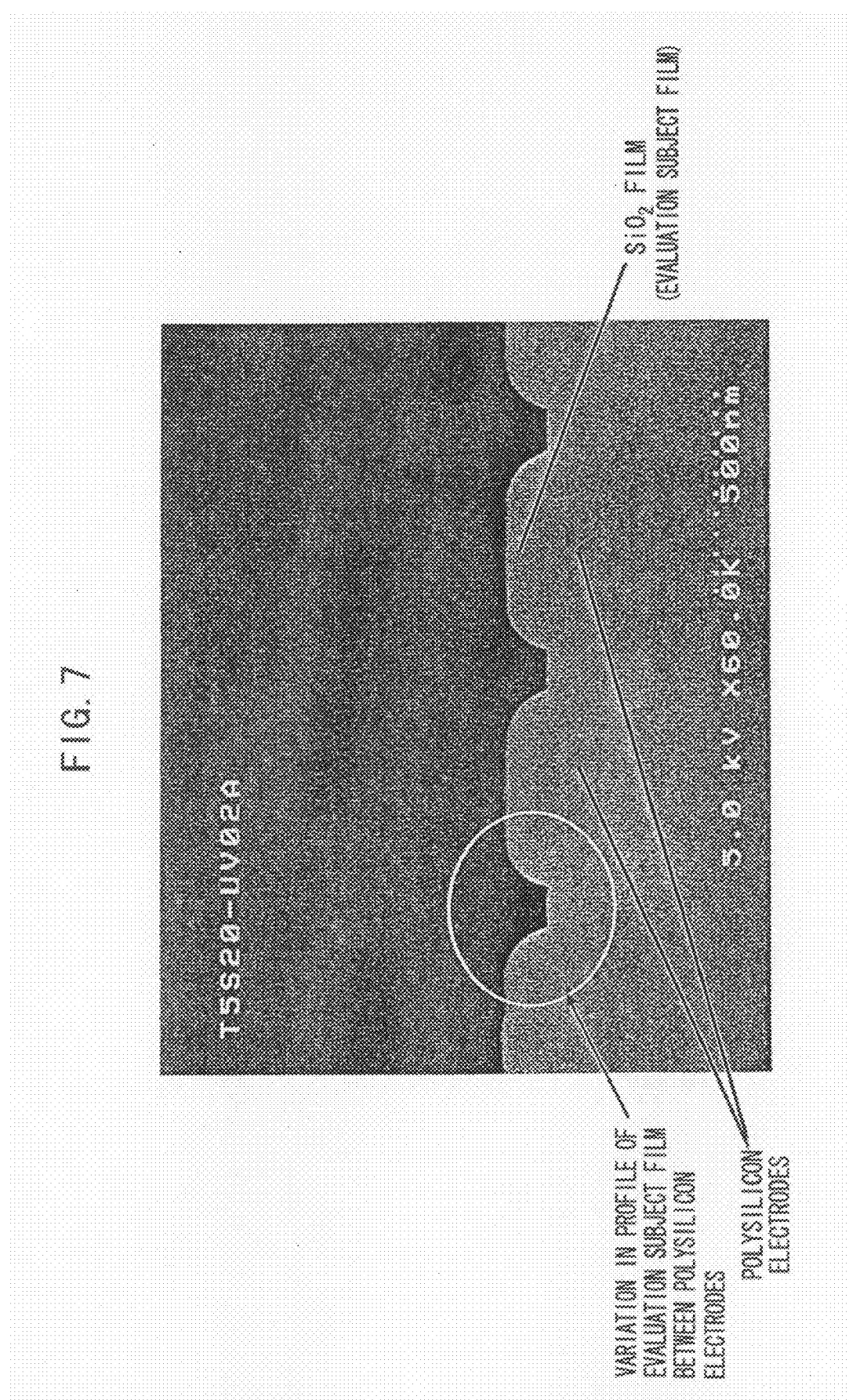

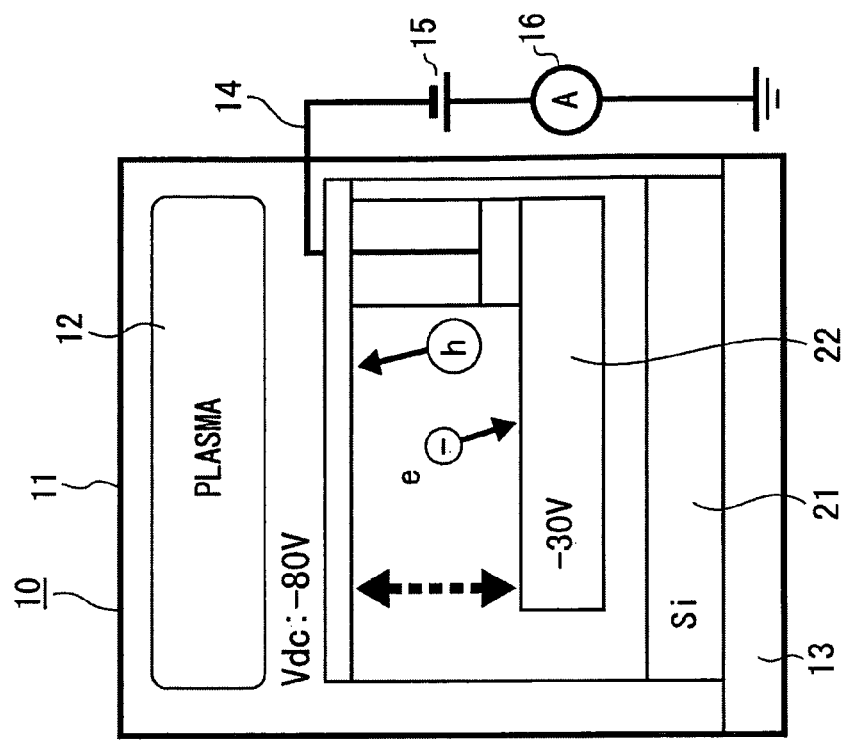
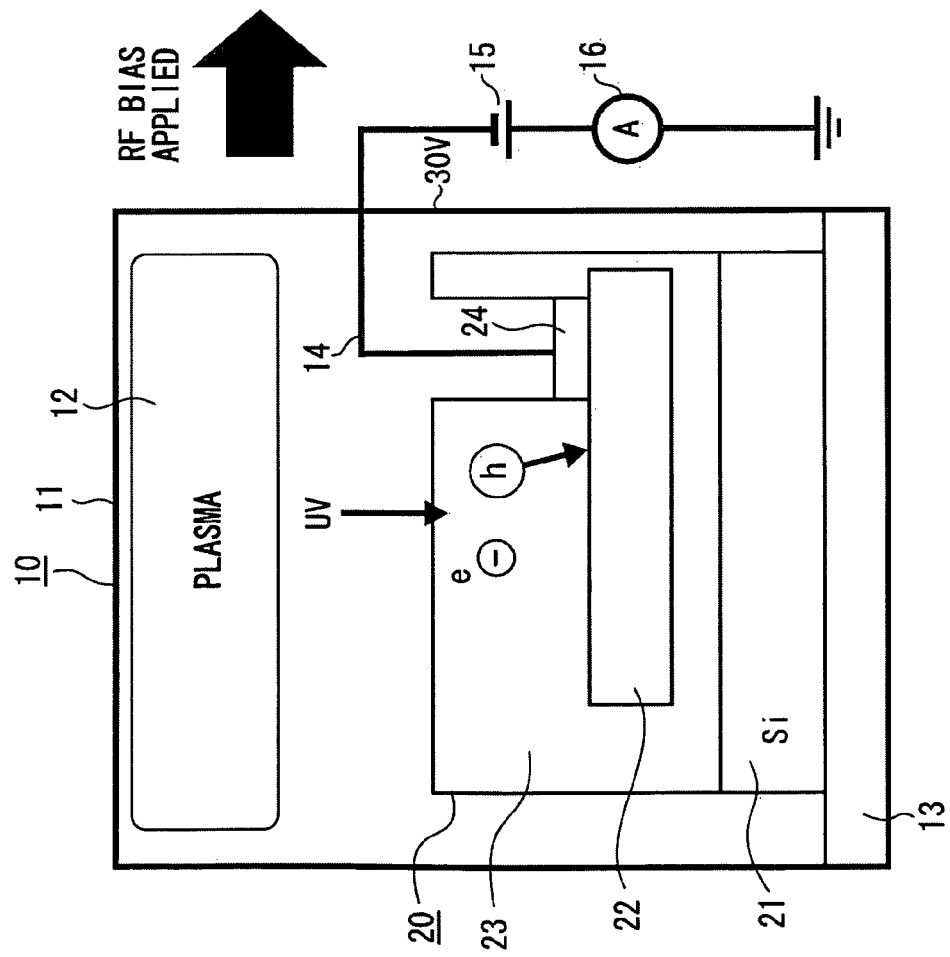
FIG. 8A RELATED ART
FIG. 8B RELATED ART

ULTRAVIOLET LIGHT MONITORING SYSTEM

CROSS-REFERENCE TO RELATED APPLICATION

This application claims priority under 35 USC 119 from Japanese Patent Application No. 2007-225676, the disclosure of which is incorporated by reference herein.

BACKGROUND OF THE INVENTION

1. Field of the Invention

The present invention relates to an ultraviolet light monitoring system that quantitatively and in real time monitors damage caused by ultraviolet light from plasma or the like in a semiconductor fabrication step (process) or the like.

2. Description of the Related Art

With the progress of miniaturization of element structures, thinning of layers and formation of three-dimensional structures in, for example, semiconductor devices, ultraviolet light irradiation damage, when ultraviolet light is emitted from a plasma which is used in a step of forming an interlayer insulation film, wiring or the like and reaches a boundary surface of a semiconductor element, has become a significant problem.

As a countermeasure, technologies have been developed for ultraviolet light monitoring systems (for example, a plasma monitoring system) which monitor ultraviolet light irradiation damage in real time at actual patterns on wafers. Methods and evaluation results of these technologies are presented in detail in documents such as, for example:

Japanese Patent Application Laid-Open (JP-A) No. 2003-282546 (below referred to as document 1);

JP-A No. 2005-236199 (below referred to as document 2);

J. Vac. Sci. Technol. A, Vol. 23, No. 6, November/December 2005, American Vacuum Society, pp. 1509-1512 (below referred to as document 3);

J. Vac. Sci. Technol. B, Vol. 23, No. 1, January/February 2005, American Vacuum Society, pp. 173-177 (below referred to as document 4); and J. Vac. Sci. Technol. B, Vol. 22, No. 6, November/December 2004, American Vacuum Society, pp. 2818-2822 (below referred to as document 5); and the like.

FIG. 8A and FIG. 8B are diagrams showing a conventional plasma monitoring system which is described in, for example, FIG. 6 of the document 2 and FIG. 2(a) on page 174 of the document 4. FIG. 8A is a schematic structural diagram, and FIG. 8B is a diagram showing problem. FIG. 9 is a schematic plan diagram showing an electrode of FIG. 8A and FIG. 8B.

The plasma monitoring system shown in FIG. 8A is provided with a plasma processing device 10. The plasma device 10 is a device which generates plasma 12 in a plasma chamber 11, which is in a vacuum state, by application of a high frequency (RF) bias voltage, and implements etching, film formation or the like on a monitoring subject 20 which is placed on a stage 13. Wiring 14 is connected to the monitoring subject 20. This wiring 14 leads out to outside the plasma chamber 11. A voltage supply 15, for applying a negative bias voltage (for example, −30 V) to the monitoring subject 20, and an ammeter 16, for measuring an induction current flowing in the monitoring subject 20, are connected in series with the wiring 14 that has been led out to the outside.

The monitoring subject 20 has a structure in which an electrode (for example, a polysilicon electrode 22 formed as a film with a substantially rectangular shape in plan view) insulated by a silicon dioxide film ($SiO_2$ film) is formed on a wafer (for example, a silicon (Si) substrate 21), and a film to be used for an actual semiconductor device (for example, a silicon dioxide film 23) is formed on the polysilicon electrode 22. A portion of the silicon dioxide film 23 is opened up and a portion of the polysilicon electrode 22 is exposed, and the wiring 14 is connected to this exposed location via a wiring connection portion 24.

At a time at which monitoring of ultraviolet light UV is to be performed, when plasma processing of the monitoring subject 20 is being implemented by application of the RF bias voltage, pairs of holes h and electrons e are generated in the silicon dioxide film 23 on the polysilicon electrode 22 by the ultraviolet light UV emitted from the plasma 12. The negative bias voltage is applied to the polysilicon electrode 22 by the voltage supply 15, and thus the holes h are measured in real time by the ammeter 16, as an induction current. This induction current is monitored as a quantitative indicator of damage to the silicon dioxide film 23 that is caused by the ultraviolet light UV.

Further, as illustrated in FIG. 2(b) on page 174 of the document 4, a structure may be employed in which a surface of the silicon dioxide film 23, including the opening portion, is covered with an aluminum (Al) based metal film, in order to eliminate effects of ions i, electrons e or the like as much as possible.

As shown in FIG. 8B, when the monitoring subject 20 is exposed to the plasma 12, the plasma 12 has been separated into positive ions, and the electrons e and holes h act to electrostatically charge up the silicon dioxide film 23. Here, because the electrons e are much lighter than the holes h, the electrons e have higher speed, and large amounts of the electrons e are accumulated on the silicon dioxide film 23. As a result, a negative potential is generated at the top of the silicon dioxide film 23 by this electron charging. Then, the slower holes h having opposite charge to the electrons e reach the top of the silicon dioxide film 23, but amounts approximately canceling out the previously charging electrons e do not cause charging. Therefore, although the negative electrons e and positive holes h from the plasma 12 both eventually reach the top of the silicon dioxide film 23 and cause charging, an initial charging amount by the negative electrons e is large. Hence, a potential at the top of the silicon dioxide film 23 is in a stable state, and is a negative potential. This negative potential is referred to as a self-aligning bias Vdc.

Thus, it is known that usually, in a plasma processing process, a self-aligning bias Vdc is generally formed with a negative potential at a pattern surface. This potential varies greatly in value depending on conditions of the plasma processing. If the self-aligning bias Vdc is, for example, −80 V, when the feed-in bias is constant (−30 V in this case), a portion of the holes h that are generated in the evaluation subject silicon dioxide film 23 by the ultraviolet light UV will be attracted in a direction toward the surface of the silicon dioxide film 23 rather than the polysilicon electrode 22, and accurate measurement of induction currents is not possible, which has been a problem.

SUMMARY OF THE INVENTION

A first aspect of the present invention provides an ultraviolet light monitoring system including: first and second electrodes that are opposingly disposed and that attract holes which are generated in accordance with irradiation of ultraviolet light; an evaluation subject film that is formed in a vicinity of the first and second electrodes and that is a subject of evaluation of damage caused by the irradiation of the ultraviolet light; and a power source that, at a time of monitoring of the ultraviolet light, applies a predetermined bias to a series path formed by the first electrode, a gap between the first and second electrodes, and the second electrode.

According to the aspect of the present invention described above, the separated first and second electrodes have an opposing structure. Thus, holes and electrons that are generated on the first and second electrodes and in the evaluation subject film between the electrodes can be captured (trapped) in a region of the gap between the first and second electrodes. As a result, effects that are caused by a self-aligning bias being formed at the surface of the evaluation subject film can be reduced, and measurements of induction current values with higher accuracy than previously are enabled.

BRIEF DESCRIPTION OF THE DRAWINGS

Preferred exemplary embodiments of the present invention will be described in detail based on the following figures, wherein:

FIG. 1 is a schematic structural diagram of an ultraviolet light monitoring system (for example, a plasma monitoring system) which illustrates a first embodiment of the present invention;

FIG. 2 is a schematic plan view showing electrodes of FIG. 1;

FIG. 3A to FIG. 3I are schematic sectional step diagrams illustrating the example of fabrication of the monitoring subject of FIG. 1;

FIG. 5 is a schematic sectional view of a monitoring subject of an ultraviolet light monitoring system (for example, a plasma monitoring system) which illustrates a third embodiment of the present invention;

FIG. 7 is a drawing showing features evident in a sectional electron microscope (SEM) photograph of a portion of the monitoring subject of FIG. 5;

FIG. 8A and FIG. 8B are diagrams showing a conventional plasma monitoring system.

DETAILED DESCRIPTION OF THE INVENTION

Figure 3F:
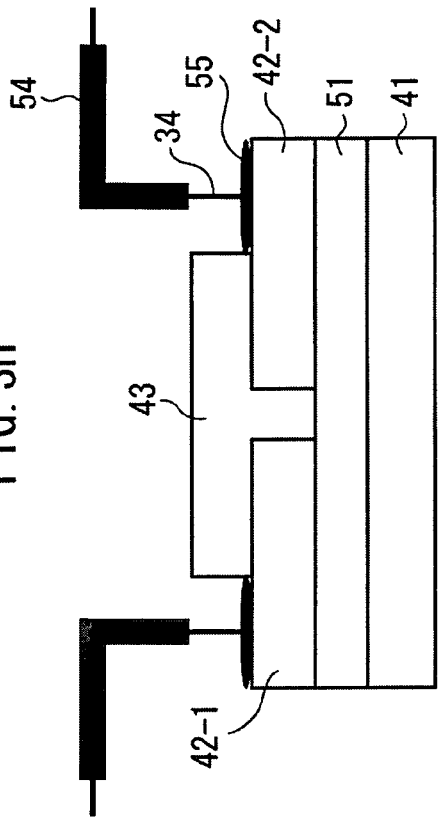
Figure 3G:
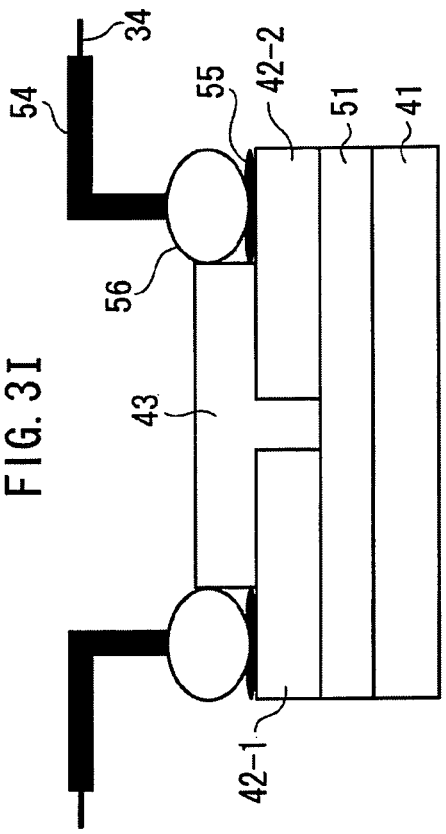
Figure 3H:
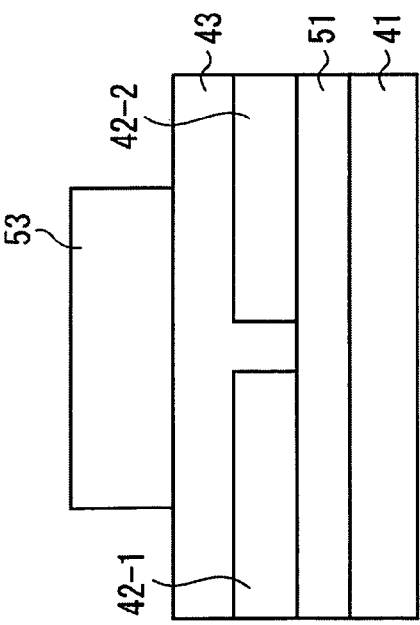

A plasma monitoring system, which is one example of an ultraviolet light monitoring system, includes: first and second electrodes that are opposingly disposed and that attract holes which are generated in accordance with irradiation of ultraviolet light, which is emitted by plasma processing; an evaluation subject film that is formed in a vicinity of the first and second electrodes and that is a subject of evaluation of damage caused by the irradiation of the ultraviolet light; and a power source that, at a time of monitoring of the ultraviolet light, applies a predetermined bias to a series path formed by the first electrode, a gap between the first and second electrodes, and the second electrode.

First Embodiment

Structure of the First Embodiment

FIG. 1 is a schematic structural diagram of an ultraviolet light monitoring system (for example, a plasma monitoring system) which illustrates a first embodiment of the present invention. FIG. 2 is a schematic plan view showing electrodes of FIG. 1.

The plasma monitoring system shown in FIG. 1 is equipped with a plasma processing device 30. The plasma device 30 is an apparatus which generates plasma 32 in a plasma chamber 31, which is in a vacuum state, by application of an RF bias voltage, and implements etching, film formation or the like on a monitoring subject 40 which has been placed on a stage 33. Wiring 34 is connected to the monitoring subject 40. This wiring 34 leads out to outside the plasma chamber 31. A voltage supply 35, for applying a negative bias voltage (for example, −30 V) to the monitoring subject 40, and an ammeter 36, for measuring an induction current flowing in the monitoring subject 40, are connected in series with the wiring 34 that has been led out to the outside.

The monitoring subject 40 includes a wafer (for example, a silicon substrate 41). First and second electrodes, which are respectively insulated by $SiO_2$ films and opposingly disposed, are formed on the silicon substrate 41. The first and second electrodes are opposingly disposed with, for example, a slit 42a with a predetermined gap therebetween. The first and second electrodes are formed by a pair of polysilicon electrodes 42-1 and 42-2, which are respectively formed as films with substantially rectangular shapes in plan view. A film that is to be used for an actual semiconductor device (for example, a silicon dioxide film 43) is formed on the pair of polysilicon electrodes 42-1 and 42-2. Portions of the silicon dioxide film 43 above the polysilicon electrodes 42-1 and 42-2 are opened up, and these portions of the polysilicon electrodes 42-1 and 42-2 are exposed. The wiring 34 is connected to these exposed locations via wiring connection portions 44-1 and 44-2.

<Example of Fabrication of the Monitoring Subject 40>

FIG. 3A to FIG. 3I are schematic sectional step diagrams illustrating an example of fabrication of the monitoring subject 40 of FIG. 1.

When the monitoring subject 40 is being fabricated, first, in a thermal oxide film formation step of FIG. 3A, a thermal oxide film 51 is formed to about 600 nm on the silicon substrate 41. In a phosphorus-doped polysilicon formation step of FIG. 3B, a polysilicon film 42 is formed on the thermal oxide film 51 with a phosphorus concentration of 6E20 atm/$cm^3$, by a vapor deposition method (below referred to as a CVD method). In an electrode photolithography step of FIG. 3C, a slit pattern 52, formed of, for example, a resist layer featuring a slit with a gap of 300 nm, is formed by a photolithography technique. In an electrode dry etching/resist ashing step of FIG. 3D, the slit pattern 52 acts as a mask and the polysilicon film 42 is processed (that is, etching of the polysilicon film 42 and ashing of the slit pattern 52 are implemented) by a dry etching technology (for example, plasma etching), and the two polysilicon electrodes 42-1 and 42-2 separated by the slit 42a are formed. In a silicon oxide film formation step of FIG. 3E, an insulation film (for example, the silicon dioxide film 43), which will be an evaluation subject of damage by ultraviolet light UV, is formed to about 150 nm by a low-pressure CVD method (below referred to as an LP-CVD method).

Then, in a pad photolithography step of FIG. 3F, a resist removal pattern 53 in the shape of a box of about 4 mm by 4 mm is formed by a photolithography technique on the silicon dioxide film 43 covering the polysilicon electrodes 42-1 and 42-2 which have been divided in two. In a pad dry etching/resist ashing step of FIG. 3G, the resist removal pattern 53 acts as a mask for an etching technique, and the silicon dioxide film 43 is processed (that is, etching of the silicon dioxide film 43 and ashing of the resist removal pattern 53 are implemented) down to the polysilicon electrodes 42-1 and 42-2 and opened up. In a pad wiring adherence step of FIG. 3H, two ends of the wiring 34, which is copper wiring or the like covered with an insulator 54, are adhered with a conductive paste 55 to the wiring connection portions 44-1 and 44-2 on the opened up polysilicon electrodes 42-1 and 42-2. Finally, in a pad connection portion molding step of FIG. 3I, a region of the conductive paste 55 is sealed with a molding resin 56, and fabrication of the monitoring subject 40 is completed.

Operation of the First Embodiment

When monitoring of ultraviolet light UV that is emitted by plasma processing is to be performed, as shown in FIG. 1, the monitoring subject 40 is placed on the stage 33 of the plasma chamber 31. End portions of the wiring 34 that are not adhered to the polysilicon electrodes 42-1 and 42-2 are led out to the outside through power input terminals provided in an outer wall of the plasma chamber 31, and are connected through the ammeter 36 to the voltage supply 35 in order to provide, for example, a negative bias voltage of −30 V.

When the negative bias voltage −30 V is applied to the monitoring subject 40 by the voltage supply 35 and an RF bias voltage is applied to the plasma processing device 30, and plasma processing (for example, etching, film formation or the like) is being carried out on the monitoring subject 40, pairs of holes h and electrons e are generated in the silicon dioxide film 43 on the polysilicon electrodes 42-1 and 42-2 by the ultraviolet light UV emitted from the plasma 32. Because the negative bias voltage −30 V is being applied to the polysilicon electrodes 42-1 and 42-2 by the voltage supply 35, the holes h that are trapped between the two polysilicon electrodes 42-1 and 42-2 can be measured in real time by the ammeter 36, as an induction current. This induction current is monitored as a quantitative indicator of damage to the silicon dioxide film 43 by the ultraviolet light UV.

Figure 9:
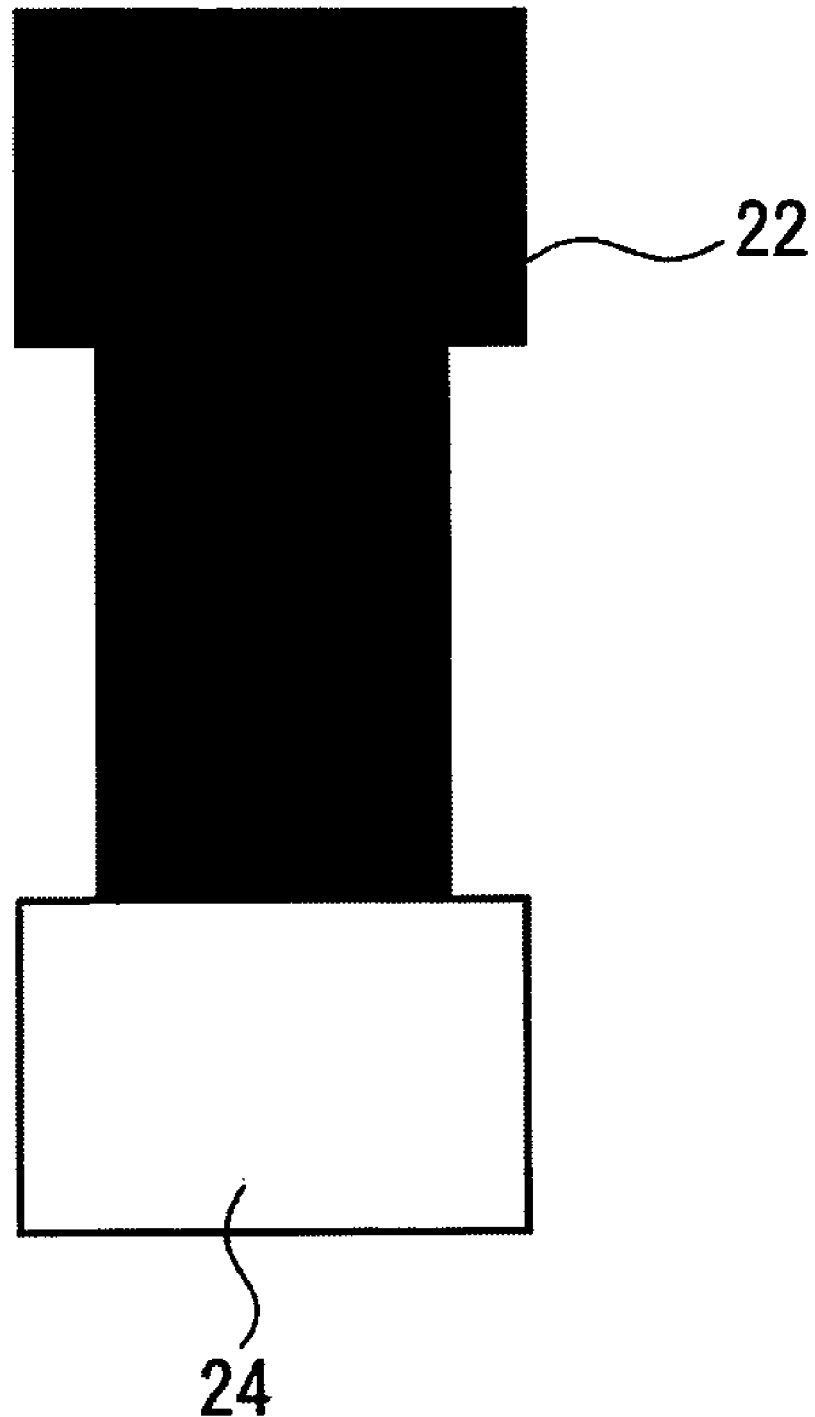
FIG. 9 is a schematic plan view showing an electrode of FIG. 8A and FIG. 8B.

That is, conventionally, holes were detected (sensed) at the surface of the polysilicon electrode 22 as shown in FIG. 9, but in the present first embodiment, as shown in FIG. 2, holes are sensed in a region (side face portions) of the slit 42a between the two opposing polysilicon electrodes 42-1 and 42-2.

Effects of the First Embodiment

According to the present first embodiment, there are effects as follows (1) and (2).

(1) The polysilicon film 42 is divided and formed into the polysilicon electrodes 42-1 and 42-2, forming the structure in which the two polysilicon electrodes 42-1 and 42-2 are opposed. Thus, holes h that are generated in the silicon dioxide film 43 on the polysilicon electrodes 42-1 and 42-2 by ultraviolet light UV can be trapped in a region of the slit 42a between the two polysilicon electrodes 42-1 and 42-2. Therefore, effects due to a self-aligning bias formed at the surface of the monitoring subject 40 can be reduced, and measurements of induction current values with higher accuracy than previously are enabled.

(2) When performing semiconductor fabrication using the plasma monitoring system of the present first embodiment, the monitoring subject 40 is adhered onto, for example, a wafer for actual plasma processing or onto the stage 33 in the vicinity thereof, or the like. Induction current values are measured by the ammeter 36, a time of completion of the plasma processing or, the like is sensed, and the fabrication process is controlled. Alternatively, with a plasma processing subject that is a wafer model, induction current values are measured by the ammeter 36, measurement results are calculated, and an actual wafer fabrication process is controlled on the basis of these measurement results. Thus, highly accurate plasma processing of wafers is enabled.

Second Embodiment

Structure and Operation of the Second Embodiment

Figure 4:
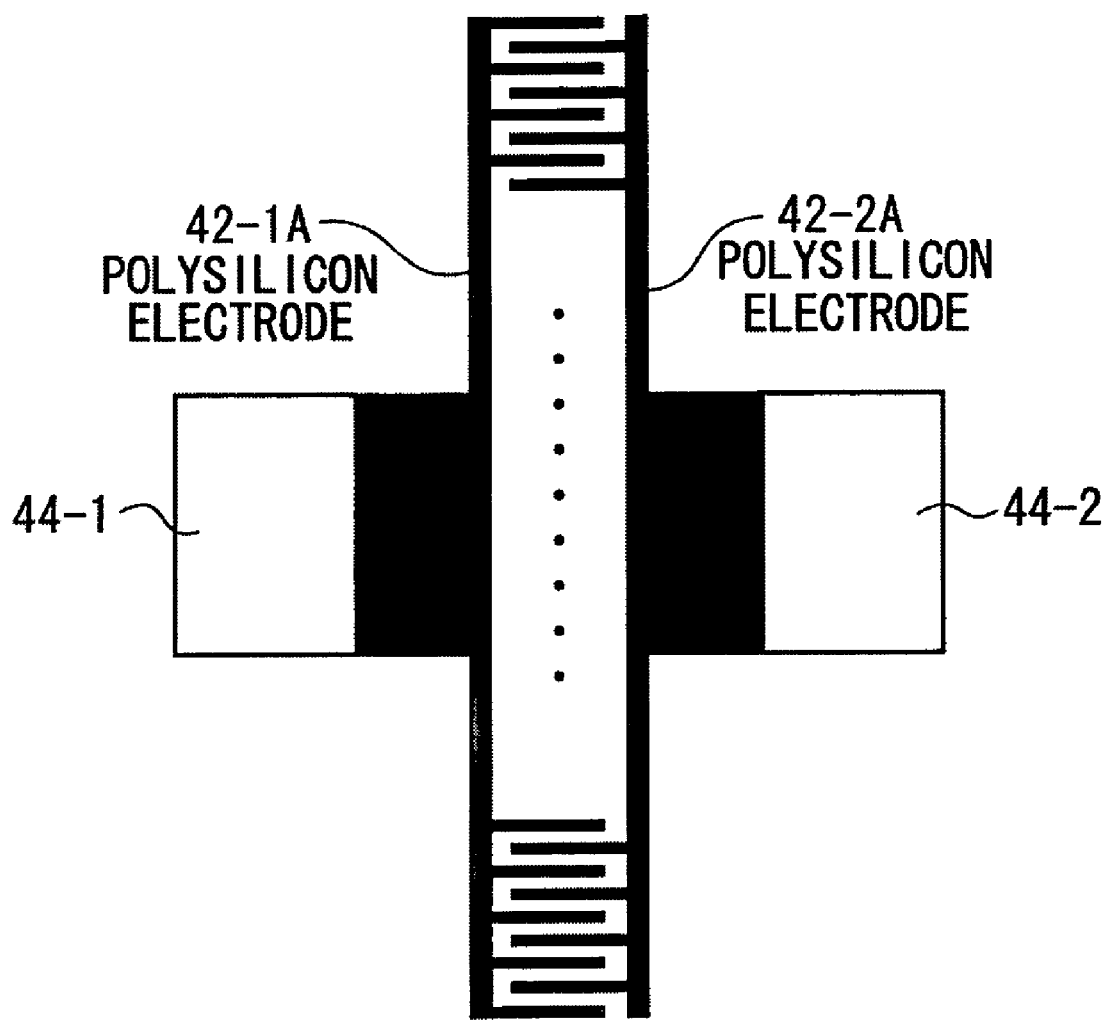
FIG. 4 is a schematic plan view showing electrodes in a monitoring subject of an ultraviolet light monitoring system (for example, a plasma monitoring system) which illustrates a second embodiment of the present invention.

FIG. 4 is a schematic plan view showing electrodes in the monitoring subject 40 of an ultraviolet light monitoring system (for example, a plasma monitoring system) which illustrates the second embodiment of the present invention. Elements in common with elements in FIG. 2 showing the first embodiment are assigned common reference numerals.

In this second embodiment, as the first and second electrodes provided in the monitoring subject 40 of FIG. 1, there are two comb shape polysilicon electrodes 42-1A and 42-2A, which are opposed at a predetermined gap (space) corresponding to the slit 42a. These two comb shape polysilicon electrodes 42-1A and 42-2A are disposed so as to mesh with one another.

In a fabrication process of the two polysilicon electrodes 42-1A and 42-2A, when photolithography and dry etching such as plasma etching or the like are performed, for example, in the pattern formation step in which the two opposing electrodes are divided as shown in FIG. 3C and FIG. 3D, the space corresponding to the slit 42a may be formed with the same width, 300 nm, and a pattern in a comb shape.

Other structures and operations are the same as in the first embodiment.

Effect of the Second Embodiment

According to the second embodiment, the two separated comb shape polysilicon electrodes 42-1A and 42-2A are opposingly disposed so as to mesh with one another. Therefore, the surface area of a region of opposition between the two polysilicon electrodes 42-1A and 42-2A is larger than in the first embodiment. Consequently, a sensing sensitivity of induction currents is improved relative to the first embodiment, and measurements with higher accuracy are enabled.

Third Embodiment

Structure of the Third Embodiment

Figure 3I:
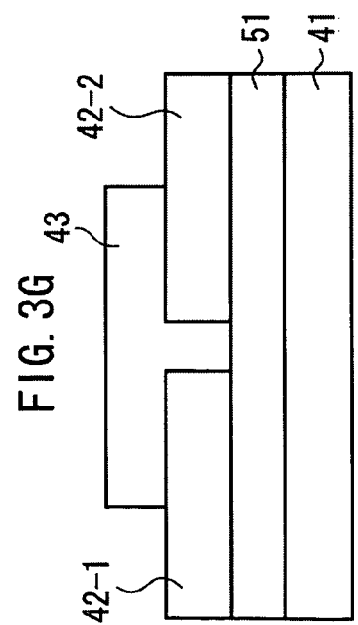

FIG. 5 is a schematic sectional view of a monitoring subject in an ultraviolet light monitoring system (for example, a plasma monitoring system) which illustrates a third embodiment of the present invention. Elements in common with elements in FIG. 1 and FIG. 3I showing the first embodiment are assigned common reference numerals.

In the plasma monitoring system of this third embodiment, instead of the monitoring subject 40 of the first embodiment shown in FIG. 1, a monitoring subject 40B with a different structure is employed. The monitoring subject 40B includes the silicon substrate 41, and the two polysilicon electrodes 42-1 and 42-2, which are first and second electrodes, are formed on the silicon substrate 41 with the thermal oxide film 51 therebetween. Similarly to the first embodiment, the two polysilicon electrodes 42-1 and 42-2 are opposingly disposed with the slit 42a with the predetermined gap therebetween. However, differently from the first embodiment, the silicon dioxide film 43 which is an evaluation subject film is disposed in the slit 42a, and the silicon dioxide film 43 is formed to the same height as top surfaces of the polysilicon electrodes 42-1 and 42-2.

A protective layer which is, for example, a silicon nitride film ($SiN_x$ film) 57 is formed on the polysilicon electrodes 42-1 and 42-2. Portions of the silicon nitride film 57 above each of the polysilicon electrodes 42-1 and 42-2 are opened up, and these portions of the polysilicon electrodes 42-1 and 42-2 are exposed. Two ends of the wiring 34, which is copper wiring or the like covered with the insulator 54, are adhered with the conductive paste 55 to wiring connection portions at these exposed locations. Regions of the conductive paste 55 are sealed with the molding resin 56.

Other structures and operations are the same as in the first embodiment.

Example of fabrication of the monitoring subject 40B: FIG. 6A to FIG. 6K are schematic sectional step diagrams showing an example of fabrication of the monitoring subject 40B of FIG. 5.

Figure 6D:
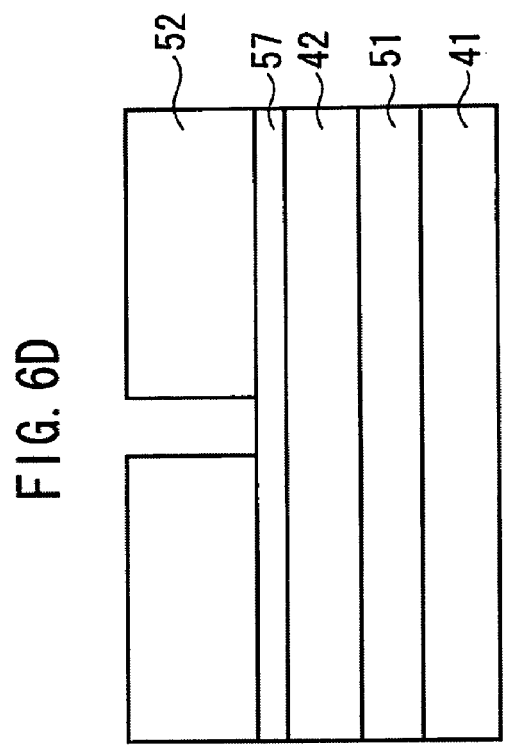
FIG. 6A to FIG. 6L are schematic sectional step diagrams illustrating the example of fabrication of the monitoring subject of FIG. 5.
Figure 6E:
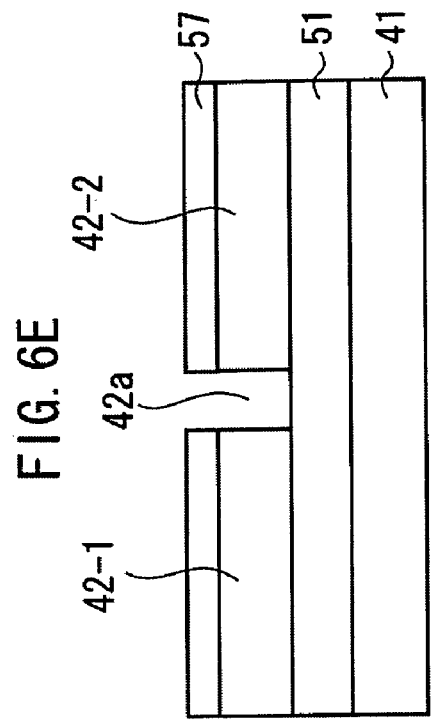
Figure 6A:
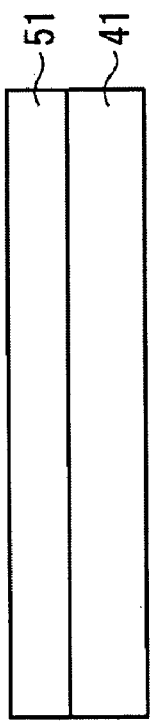
Figure 6B:
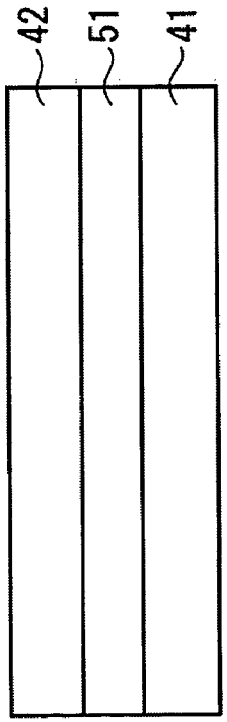
Figure 6C:
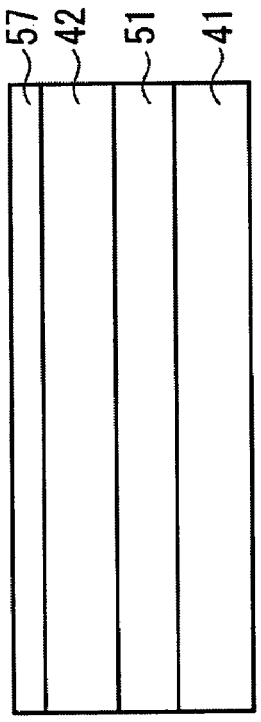
Figure 6H:
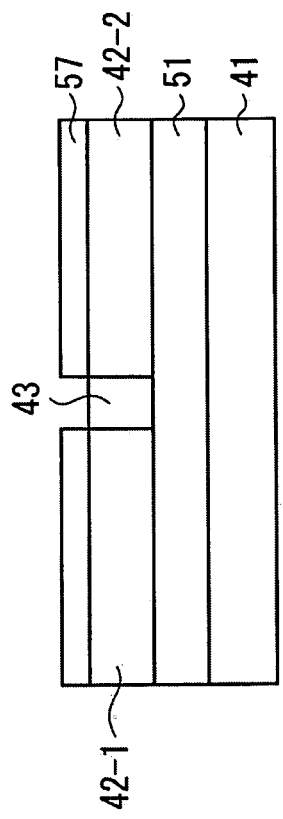

When the monitoring subject 40B is to be fabricated, first, in a thermal oxide film formation step of FIG. 6A, the thermal oxide film 51 is formed to about 600 nm on the silicon substrate 41. In a phosphorus-doped polysilicon formation step of FIG. 6B, the polysilicon film 42 is formed on the thermal oxide film 51 with a phosphorus concentration of $6E20$ atm/$cm^3$ by the CVD method. In a silicon nitride film formation step of FIG. 6C, the silicon nitride film 57 is formed to about 100 nm by the LP-CVD method on the polysilicon film 42. In an electrode photolithography step of FIG. 6D, the slit pattern 52, formed of, for example, a resist layer including the slit 42a of about 300 nm, is formed on the silicon nitride film 57 by the photolithography technique. In an electrode dry etching/resist ashing step of FIG. 6E, the slit pattern 52 acts as a mask and the silicon nitride film 57 and the polysilicon film 42 are etched by a dry etching technology such as plasma etching or the like, and this polysilicon film 42 is divided to form the two polysilicon electrodes 42-1 and 42-2, which are the first and second electrodes. Thereafter, the slit pattern 52 is ashed and removed.

Figure 6F:
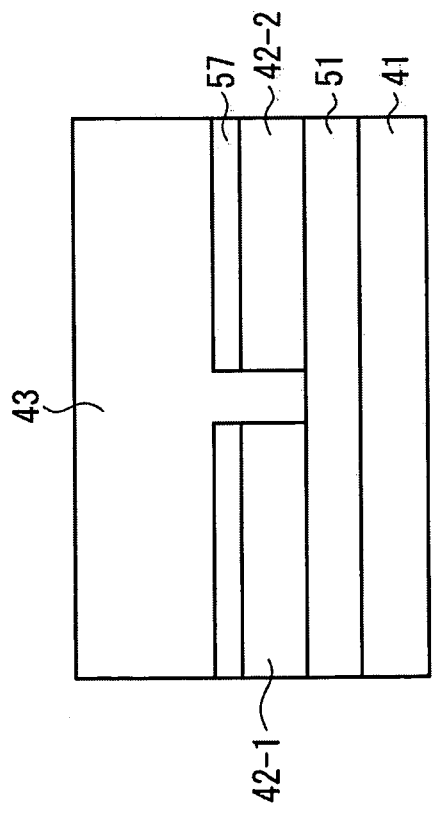
Figure 6G:
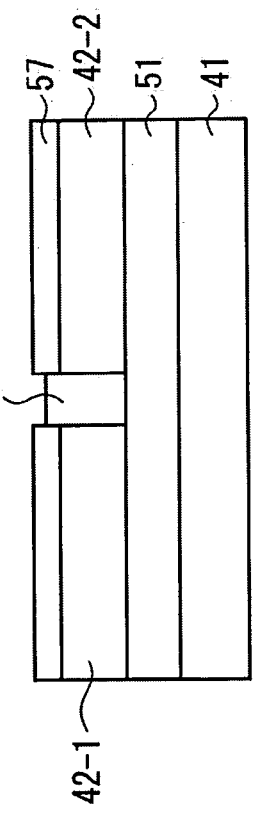

Then, in a silicon oxide film formation step of FIG. 6F, a silicon-based insulation film (for example, the silicon dioxide film 43), which is an evaluation subject film for evaluating damage caused by ultraviolet light UV from high-density plasma (below referred to as HDP), is formed to about 1000 nm. In a silicon dioxide film smoothing step of FIG. 6G, the silicon dioxide film 43 is ground and smoothed by a chemical-mechanical polishing method (below referred to as a CMP method). In addition, the silicon nitride film 57 is ground to close to around 50 nm from the surface. In a silicon dioxide film wet-etching step of FIG. 6H, the surface of the silicon dioxide film 43 is etched by, for example, a 0.3% hydrofluoric acid solution so as to be at the same height as the top faces of the polysilicon electrodes 42-1 and 42-2.

Figure 6I:
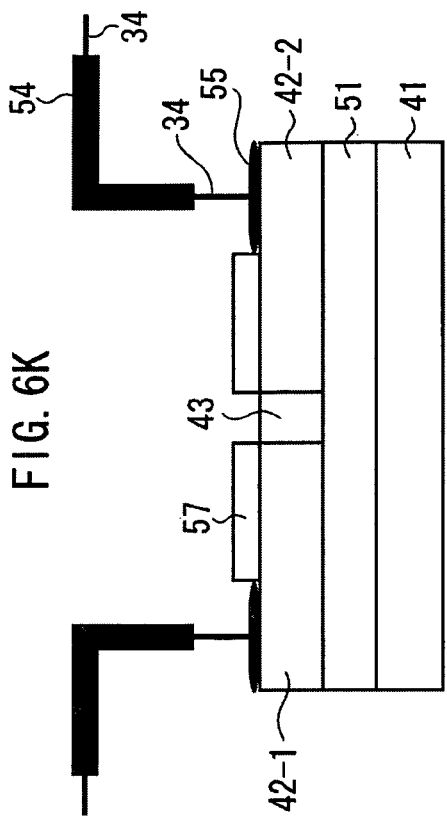
Figure 6K:
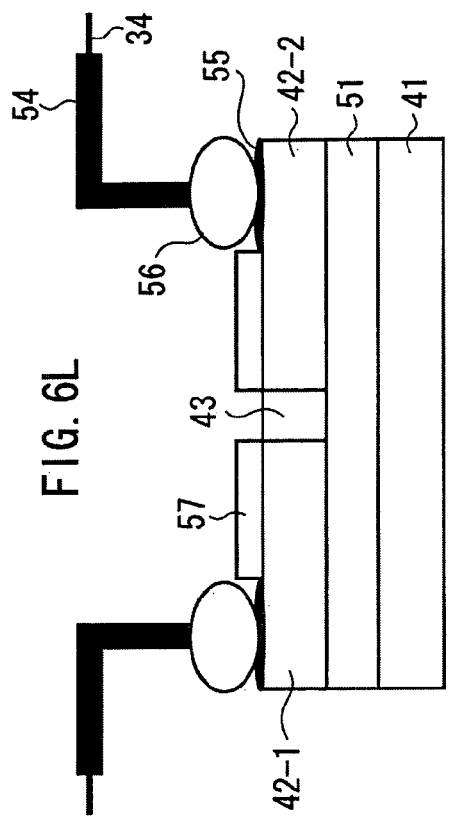
Figure 6J:
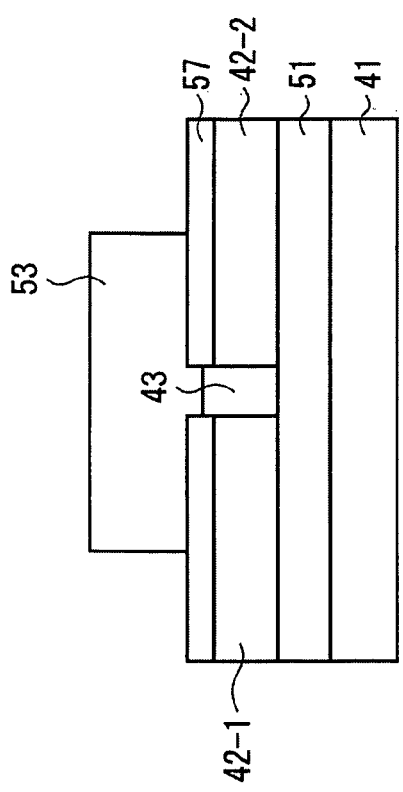
Figure 6L:
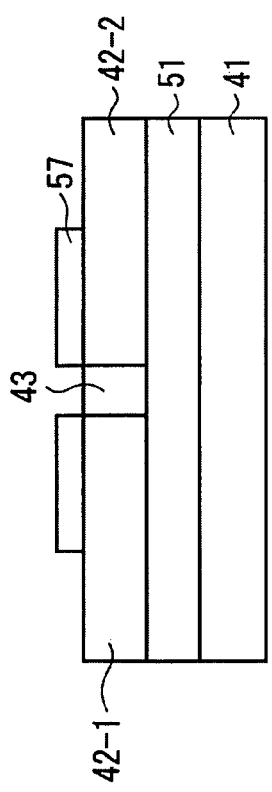

In a pad photolithography step of FIG. 6I, the resist removal pattern 53 in the shape of a box of about 4 mm by 4 mm is formed by the photolithography technique on the laminate of the silicon nitride film 57 and the polysilicon electrodes 42-1 and 42-2 which have been divided in two. In a pad dry etching/resist ashing step of FIG. 6J, the resist removal pattern 53 acts as a mask, the silicon nitride film 57 is ground down to the polysilicon electrodes 42-1 and 42-2 and opened up by dry etching such as plasma etching or the like, and the resist removal pattern 53 is ashed and removed. In a pad wiring adherence step of FIG. 6K, two ends of the wiring 34, which are each covered with the insulator 54, are adhered with the conductive paste 55 to the wiring connection portions on the opened up polysilicon electrodes 42-1 and 42-2. Thereafter, in a pad connection portion molding step which is shown in FIG. 6L, the conductive paste 55 is sealed with the molding resin 56, and fabrication of the monitoring subject 40B is completed.

Operation of the Third Embodiment

Operation of the monitoring subject 40B when performing monitoring of ultraviolet light UV which is emitted by plasma processing is the same as in the first embodiment.

Effects of the Third Embodiment

According to the present third embodiment, there are effects as follows (a) and (b).

(a) FIG. 7 is a drawing showing features evident in a sectional electron microscope (SEM) photograph of a portion of the monitoring subject 40B of FIG. 5.

According to the third embodiment, the surfaces of the polysilicon electrodes 42-1 and 42-2 and the surface of the silicon dioxide film 43 which is the evaluation subject film are aligned to the same height. Thus, as shown in FIG. 7, film thickness and height between the two polysilicon electrodes 42-1 and 42-2 are always constant and optimal, and unaffected by film-forming characteristics in relation to the polysilicon electrodes 42-1 and 42-2 of the film that is to be evaluated. Therefore, correlations between wavelengths of ultraviolet light UV and films to be evaluated are stable, and measurements with higher accuracy are enabled.

(b) In this third embodiment, the polysilicon electrodes 42-1 and 42-2 which are the same as in the first embodiment are used. However, if the polysilicon electrodes 42-1A and 42-2A of the second embodiment are employed, the second embodiment and the third embodiment provide the same operational effect.

<Modifications>

The present invention is not limited to the embodiments described above, and numerous modes of use and alterations are possible. Examples of such modes of use and alterations include, for example, the following (i) to (iii).

(i) For the present invention, the structures, fabrication methods and the like of the illustrated plasma processing device 30 and monitoring subjects 40 and 40B may be altered to modes other than those illustrated.

(ii) For the first to third embodiments, examples have been described in which the silicon dioxide film 43, which is a silicon oxide-based insulation film, serves as an evaluation object film. However, application is also possible to plurally laminated films, silicon oxide-based nitride films, organic-type low inductance films and so forth.

(iii) For the first to third embodiments, descriptions have been given assuming damage to a product from ultraviolet light UV in a plasma processing step of semiconductor fabrication. However, the present invention is also applicable to any other plasma step beside a step in semiconductor fabrication, such as in flat panel fabrication or the like, to monitoring of ultraviolet light UV from sources other than plasma, and so forth.

What is claimed is:

1. An ultraviolet light monitoring system comprising:
   first and second electrodes that are opposingly disposed and that attract holes which are generated in accordance with irradiation of ultraviolet light;
   an evaluation subject film that is formed in a vicinity of the first and second electrodes and that is a subject of evaluation of damage caused by the irradiation of the ultraviolet light; and
   a power source that, at a time of monitoring of the ultraviolet light, applies a predetermined bias to a series path formed by the first electrode, a gap between the first and second electrodes, and the second electrode.

2. The ultraviolet light monitoring system of claim 1, wherein the first and second electrodes are formed by square conductive films disposed in parallel.

3. The ultraviolet light monitoring system of claim 2, wherein the evaluation subject film is formed on the first and second electrodes and is irradiated with the ultraviolet light.

4. The ultraviolet light monitoring system of claim 3, wherein the ultraviolet light is emitted by plasma processing.

5. The ultraviolet light monitoring system of claim 2, wherein the evaluation subject film is disposed in the gap between the first and second electrodes, is formed to a height the same as a surface of the first and second electrodes, and is irradiated with the ultraviolet light, and
   a protective film is formed on the first and second electrodes.

6. The ultraviolet light monitoring system of claim 2, wherein the ultraviolet light is emitted by plasma processing.

7. The ultraviolet light monitoring system of claim 1, wherein the first and second electrodes are formed by comb shape conductive films disposed so as to mesh with one another.

8. The ultraviolet light monitoring system of claim 7, wherein the evaluation subject film is formed on the first and second electrodes and is irradiated with the ultraviolet light.

9. The ultraviolet light monitoring system of claim 7, wherein the evaluation subject film is disposed in the gap between the first and second electrodes, is formed to a height the same as a surface of the first and second electrodes, and is irradiated with the ultraviolet light, and
   a protective film is formed on the first and second electrodes.

10. The ultraviolet light monitoring system of claim 7, wherein the ultraviolet light is emitted by plasma processing.

11. The ultraviolet light monitoring system of claim 1, wherein the ultraviolet light is emitted by plasma processing.

* * * * *